(12) United States Patent
Nadiguebe

(10) Patent No.: US 8,184,027 B2
(45) Date of Patent: May 22, 2012

(54) SEMICONDUCTOR DEVICE AND DIFFERENTIAL AMPLIFIER CIRCUIT THEREFOR

(75) Inventor: Alain Nadiguebe, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 62 days.

(21) Appl. No.: 12/811,441

(22) PCT Filed: Jan. 8, 2008

(86) PCT No.: PCT/IB2008/051267
§ 371 (c)(1),
(2), (4) Date: Jul. 1, 2010

(87) PCT Pub. No.: WO2009/087490
PCT Pub. Date: Jul. 16, 2009

(65) Prior Publication Data
US 2010/0283652 A1 Nov. 11, 2010

(51) Int. Cl.
*H03M 1/06* (2006.01)
(52) U.S. Cl. ........................... 341/118; 341/172
(58) Field of Classification Search ............ 341/172, 341/118, 155; 327/96; 330/9
See application file for complete search history.

(56) References Cited

U.S. PATENT DOCUMENTS

| | | | |
|---|---|---|---|
| 6,573,785 B1 * | 6/2003 | Callicotte et al. | 330/9 |
| 6,825,739 B2 * | 11/2004 | Fujimoto | 333/173 |
| 7,633,423 B2 * | 12/2009 | Cho | 341/161 |
| 2006/0132341 A1 | 6/2006 | Koh et al. | |
| 2008/0094140 A1 * | 4/2008 | Lim et al. | 330/260 |

OTHER PUBLICATIONS

Choi Y et al: "SC Amplifier and SC Integrator with an Accurate Gain of 2" IEEE Transactions on Circuits and Systems II: Express Briefs, IEEE Service Center, New York, NY, US, vol. 52, No. 4, Apr. 1, 2005, pp. 194-198.
Zare-Hoseini H et al: "A New Structure for Capacitor-Mismatch-Insensitive Multiply-By-Two Amplification" ASIC, 2005, Asicon 2005, 6th International Conference on Shanghai, China Oct. 24-27, 2005, Piscataway, NJ, USA, IEEE, vol. 1, Oct. 24, 2005, pp. 499-503.
Zare-Hoseini H et al: "A New Multiply-by-Two Gain-Stage with Enhanced Immunity to Capacitor-Mismatch" Circuits and Systems, 2005, ISCAS 2005, IEEE International Symposium O N Kobe, Japan May 23-26, 2005, Piscataway, NJ, USA, IEEE, May 23, 2005, pp. 1409-1412.
Song Bang-Sup et al: "A 12-bit 1-Msample/s Capacitor Error-Averaging Pipelined A/D Converter" IEEE Journal of Solid-State Circuits, vol. 23, No. 6, Dec. 1988, pp. 1324-1333.
Ginetti Bernard et al: "A CMOS 13-b Cyclic RSd A/D Converter" IEEE Journal of Solid-State Circuits, vol. 27, No. 7, Jul. 1992, pp. 957-965.
Li Ping Wai et al: "A Ratio-Independent Algorithmic Analog-to-Digital Conversion Technique" IEEE Journal of Solid-State Circuits, vol. sc-19, No. 6, Dec. 1984, pp. 828-836.
International Search Report and Written Opinion correlating to PCT/IB2008/051267 dated Oct. 17, 2008.

* cited by examiner

*Primary Examiner* — Brian Young

(57) ABSTRACT

A differential amplifier circuit comprising a differential amplifier capacitor and a mismatch error cancellation circuitry, a first pair of capacitors, a second pair of capacitors consisting of switching network. The switching network is arranged to operate in a first configuration wherein the first pair of capacitors is operably coupled to differential inputs of the differential amplifier circuit. The switching network is further arranged to operate in second configuration wherein each capacitor of the first pair of capacitors is operably coupled within a feedback loop between an output and an input of the differential amplifier such that the differential amplifier outputs signals representative of the sampled input voltage signals, and the second pair of capacitors are operably coupled in parallel between the outputs of the differential amplifier such that the second pair of capacitors sample the voltage difference between the outputs.

20 Claims, 10 Drawing Sheets

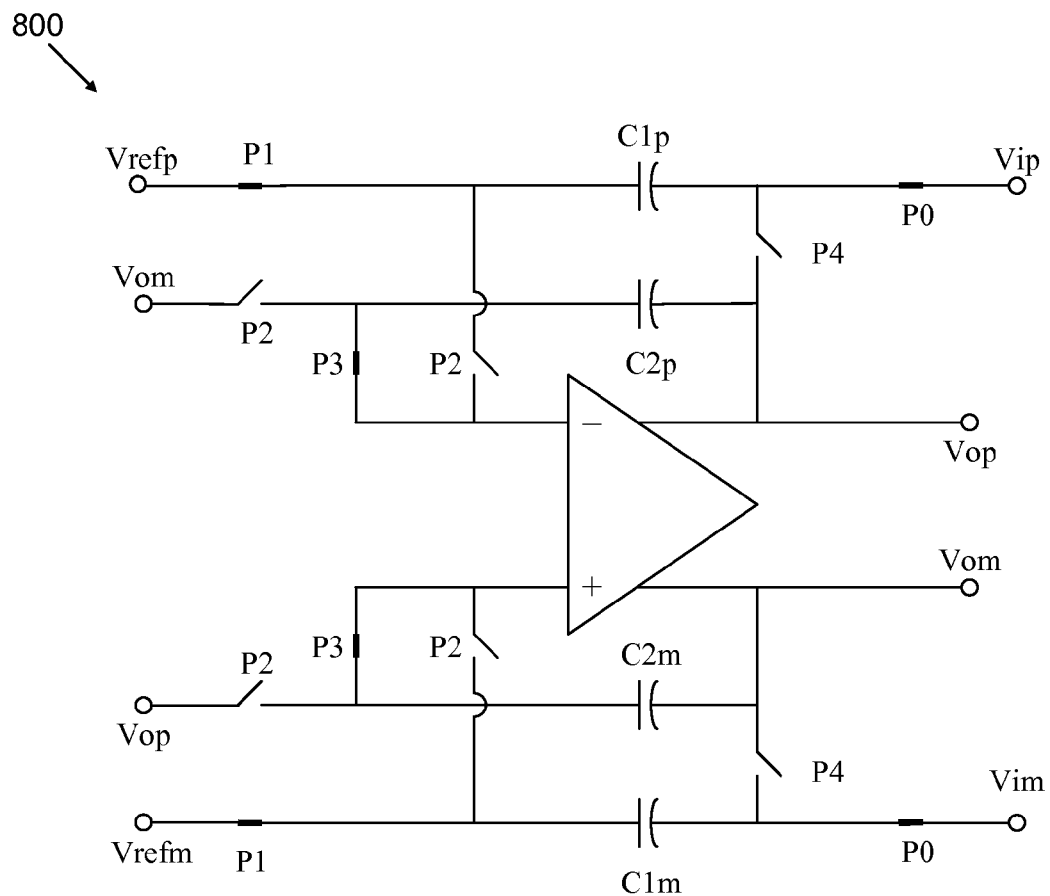
FIG. 9
FIG. 10
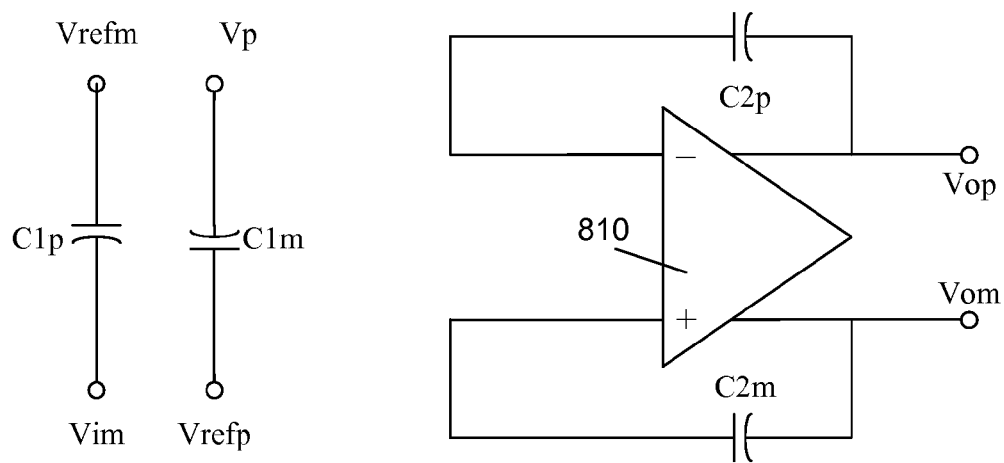

US 8,184,027 B2

SEMICONDUCTOR DEVICE AND DIFFERENTIAL AMPLIFIER CIRCUIT THEREFOR

FIELD OF THE INVENTION

The invention relates to a differential amplifier circuit, and more particularly to a differential amplifier circuit comprising capacitor mismatch error cancellation circuitry.

BACKGROUND OF THE INVENTION

An analog-to-digital converter (also known as an ADC or an ND converter) is an electronic circuit that measures a real-world signal (such as temperature, pressure, acceleration, and speed) and converts it to a digital representation of the signal. An ADC compares an analog input to a known reference and produces therefrom a digital representation of this analog input. The output of an ADC is a digital binary code. By its nature, an ADC introduces a quantization error. This is simply the information that is lost, because for a continuous analog signal there are an infinite number of voltages but only a finite number of ADC digital codes. The more digital codes that the ADC can resolve, the more resolution it provides and the less information lost to quantization error.

A Nyquist limit is defined as half of the sampling frequency. The Nyquist limit sets the highest frequency that a system is able to sample without frequency aliasing. In a sampled data system, when the input signal of interest is sampled at a rate slower than the Nyquist limit ($f_{IN} > 0.5 f_{SAMPLE}$), the signal is effectively 'folded back' into the Nyquist band, thus appearing to be at a lower frequency than it actually is. This unwanted signal is indistinguishable from other signals in the desired frequency band ($f_{SAMPLE}/2$).

An algorithmic-based nyquist ADC's performance relies on an ability to accurately achieve a times two (×2) gain. For ADC resolutions above 10 bits the ×2 gain is a constraint to a good linearity.

FIG. 1 illustrates a known ratio-independent technique for correcting capacitor mismatch errors within, for example, an ADC amplifier circuit. The design structure of this known technique allows capacitor mismatch cancellation using four clock phases. FIG. 2 illustrates the configuration of the circuitry within each of the four clock cycles (a) to (d). This known technique provides a ratio-independent multiply-by-two switching sequence, whereby an input voltage is sampled in the first clock phase (a); the charge is then transferred in the second clock phase (b); the input voltage is then sampled again the third clock phase (c); and finally the charge is transferred and capacitors exchanged in the fourth clock phase (d).

A problem with this, and other, known techniques is that it requires a complex switching network, requiring a complex clock scheme. In addition, such techniques require a separate 'sample & hold' stage, resulting in increased power consumption and increasing the amount of die space required. Furthermore, the large number of capacitors used for such techniques require a significant amount of die space.

As will be appreciated by a skilled artisan, market demands require not only a reduction in the cost and size of integrated circuits and the like, but also a reduction in their power consumption requirements in order to improve battery performance of device within which such integrated circuits and the like are used.

Thus, a need exists for an improved differential amplifier circuitry in which the above-mentioned problems are substantially alleviated.

SUMMARY OF THE INVENTION

In accordance with aspects of the invention, there is provided a differential amplifier circuit, and a digital to analogue converter and semiconductor device comprising a differential amplifier circuit, as defined in the appended Claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

FIGS. 8 to 14 illustrate a differential amplifier circuit according to some alternative embodiments of the present invention.

DESCRIPTION OF EMBODIMENTS

Embodiments of the invention will be described in terms of a differential amplifier circuit for a digital to analogue converter.

Although embodiments of the invention will be described in terms of a digital to analogue converter, it will be appreciated that the inventive concept herein described may be embodied in any apparatus that incorporates a differential amplifier circuit, and for which capacitor mismatch error cancellation is desirable and/or required.

An example of an embodiment of a differential amplifier circuit in accordance with the invention may comprises a differential amplifier stage arranged to provide unity gain functionality and capacitor mismatch error cancellation circuitry. The capacitor mismatch error cancellation circuitry may comprise a first pair of capacitors, a second pair of capacitors and a switching network. The switching network may be arranged to operate in a first configuration wherein the first pair of capacitors are operably coupled to differential inputs of the differential amplifier circuit such that the first pair of capacitors sample input voltage signals present on the differential inputs, and each capacitor of the second pair of capacitors is operably coupled within a feedback loop between an output and an input of the amplifier stage. The switching network may further be arranged to operate in a second configuration wherein each capacitor of the first pair of capacitors is operably coupled within a feedback loop between an output and an input of the amplifier stage such that the amplifier stage is set to output signals representative of the sampled input voltage signals, and the second pair of capacitors are operably coupled in parallel between the outputs of the amplifier stage such that the second pair of capacitors sample the voltage difference between the outputs.

Figure 1:
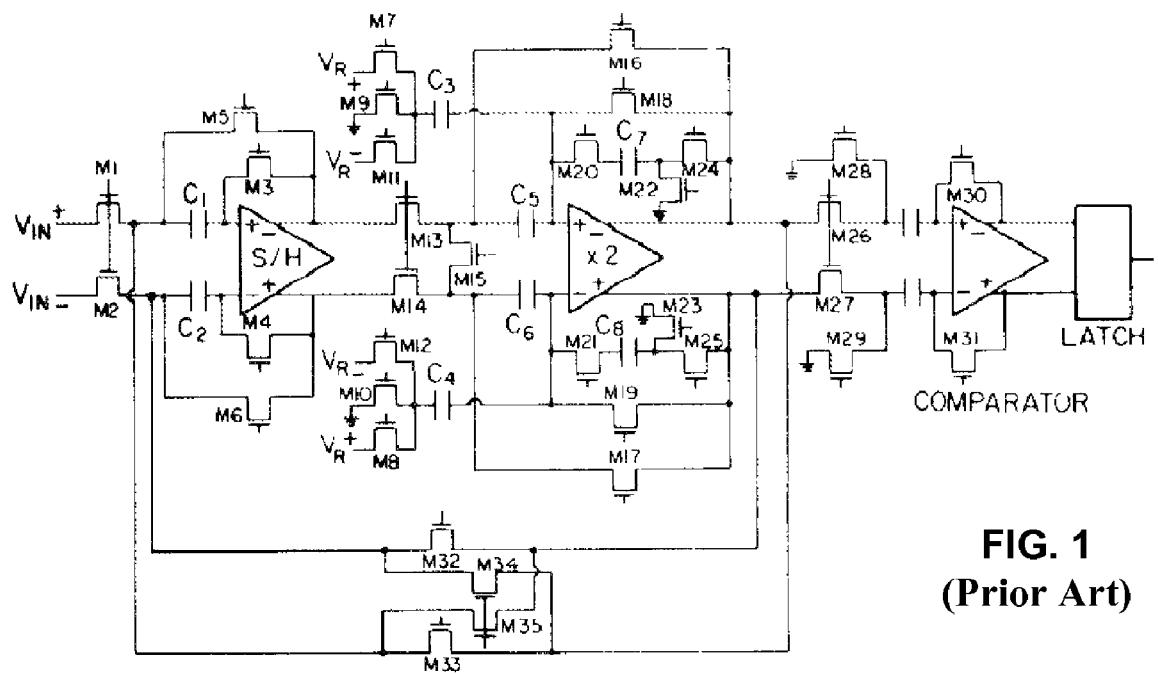
FIGS. 1 and 2 illustrate a known ratio-independent technique for correcting capacitor mismatch errors.
Figure 2:
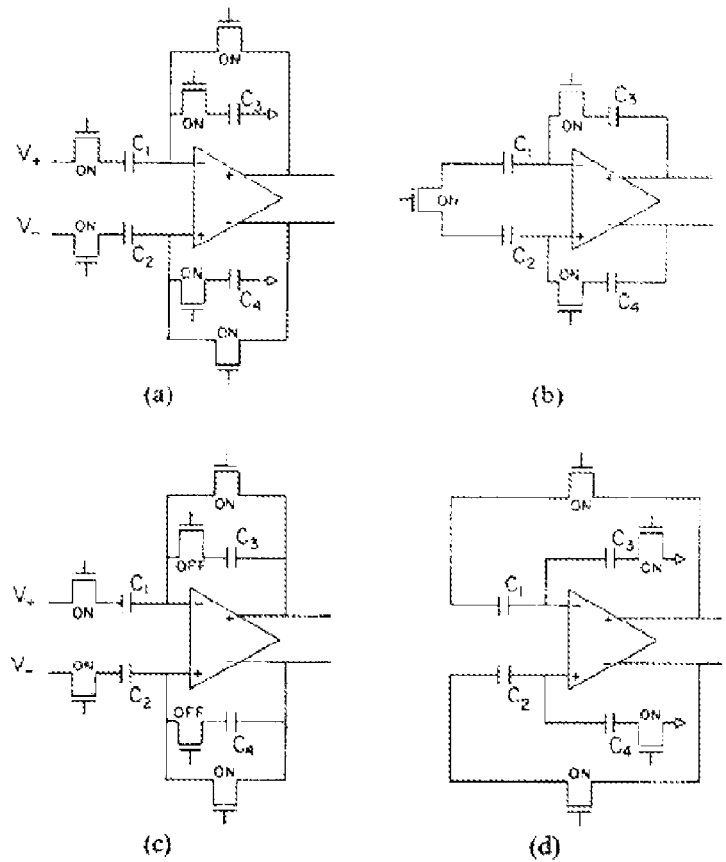
Figure 3:
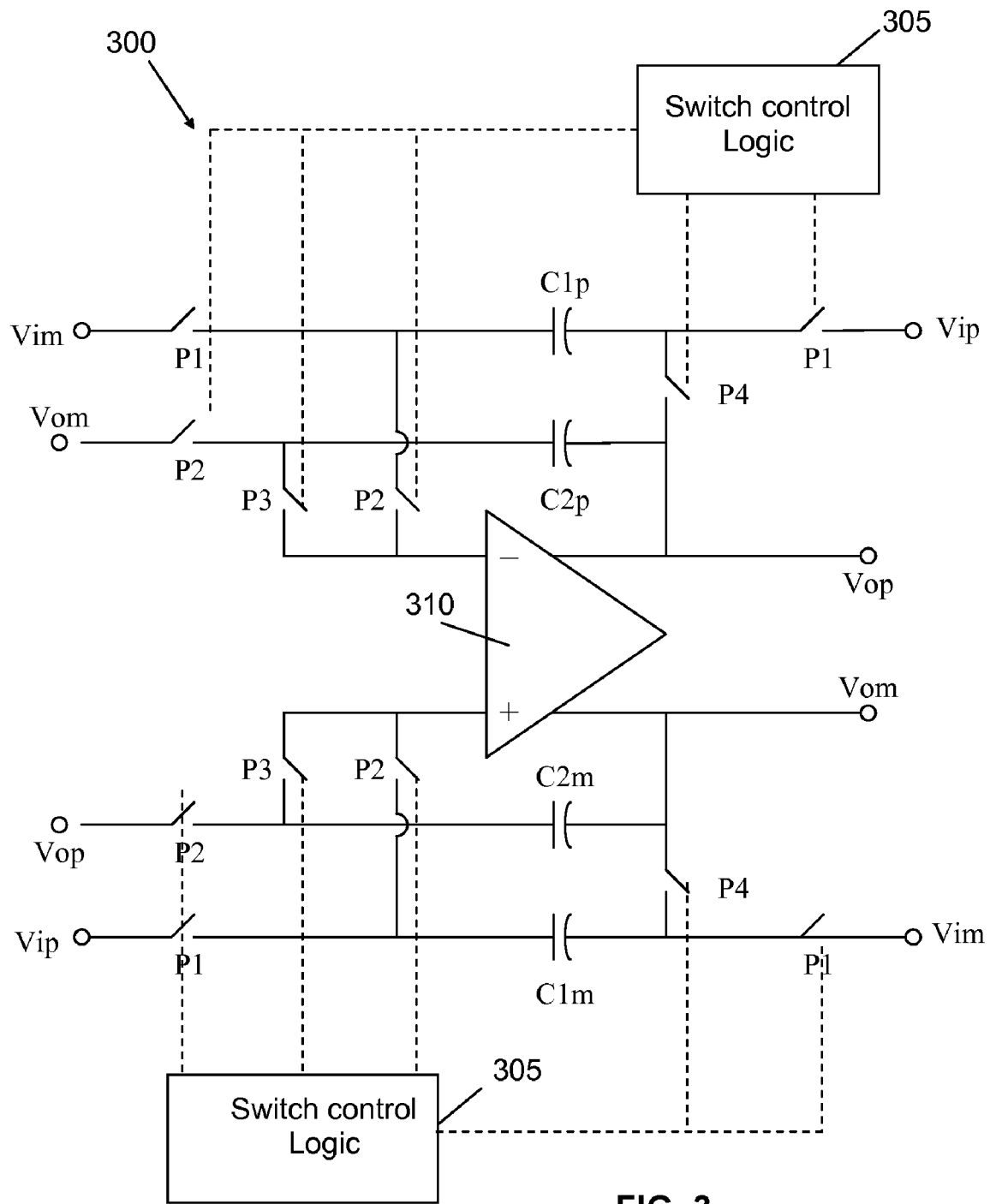
FIGS. 3 to 7 illustrate a differential amplifier circuit according to some embodiments of the present invention.

Referring now to FIG. 3 there is illustrated an example of an embodiment of a differential amplifier circuit 300 according to some embodiments of the present invention. The shown differential amplifier circuit 300 comprises a differential amplifier stage 310 arranged to provide unity gain functionality, first and second differential inputs (Vim, Vip), first and second differential outputs (Vom, Vop), and capacitor mismatch error cancellation circuitry. The capacitor mismatch error cancellation circuitry comprises a first pair of capacitors (C1m, C1p), a second pair of capacitors (C2m, C2p) and a switching network, which for the illustrated embodiment comprises switches P1 to P4. The respective switches of the switching network are controlled by switching control logic 305, as illustrated.

Figure 4:
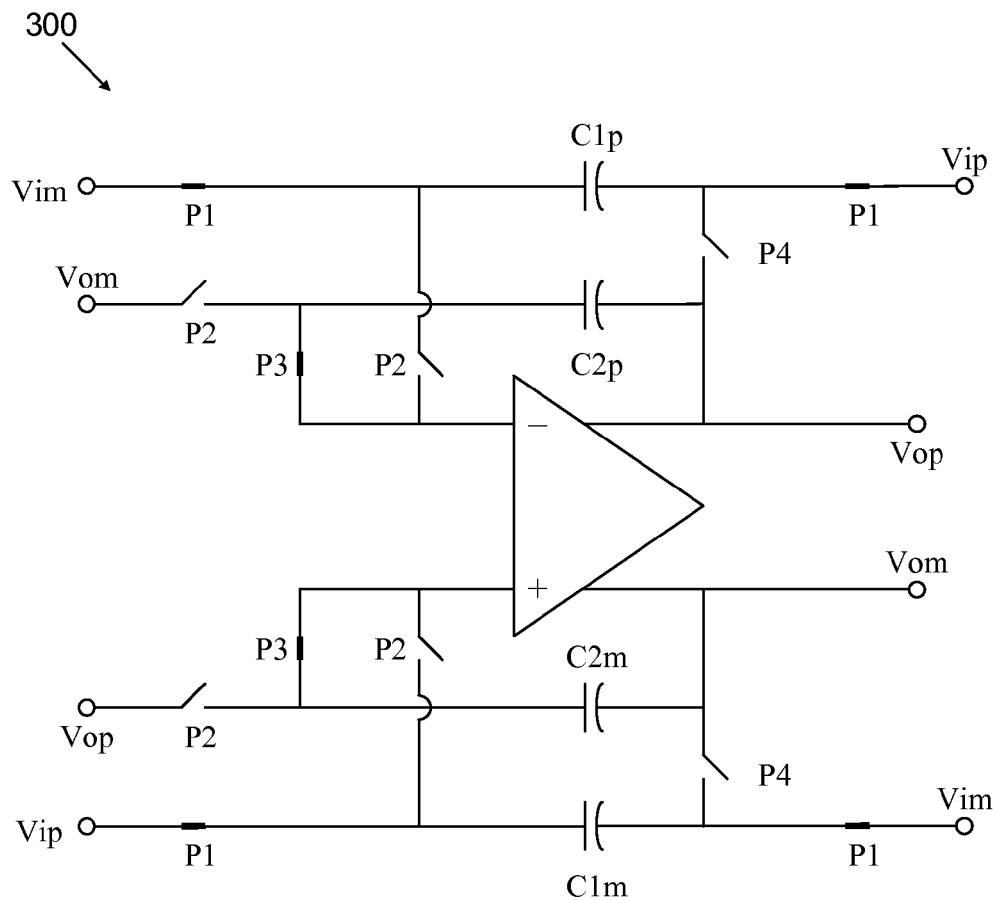

Referring now to FIG. 4, there is illustrated the differential amplifier circuit 300 with the switching network arranged to operate in a first configuration, wherein voltage signals present on the first and second differential inputs (Vim, Vip) are sampled by operably coupling the first pair of capacitors (C1m, C1p) to the first and second differential inputs (Vim, Vip). In particular, for the embodiment illustrated in FIG. 4, the switching network is configured such that switches P1 and P3 are closed, whilst switches P2 and P4 are open. The respective switches of the switching network are again controlled by switching control logic (as in FIG. 3, but not shown for clarity purposes only).

Figure 5:
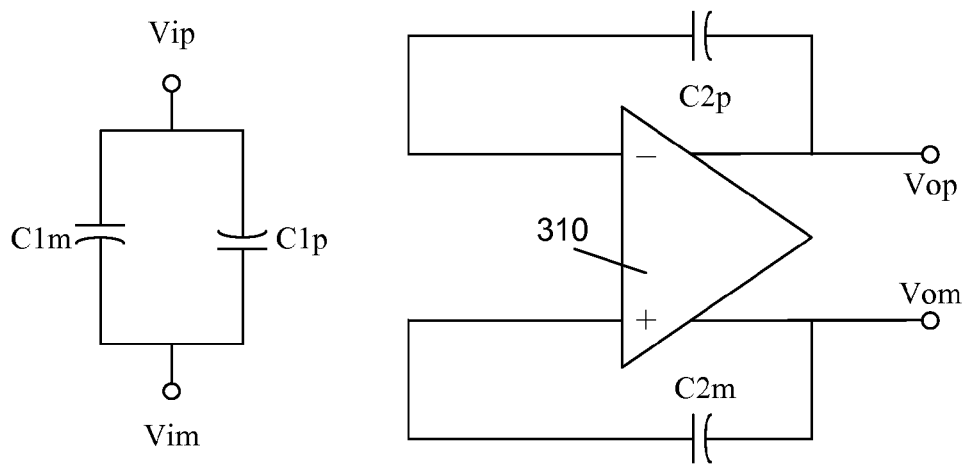

FIG. 5 illustrates the equivalent circuit layout of the differential amplifier circuit 300 with the switching network arranged to operate in the first configuration. As can be seen, the first pair of capacitors (C1m, C1p) is connected in parallel between the two differential inputs (Vim, Vip). Here, 2*(Vip−Vim) is sampled. In this manner, the charge Q1m, Q1p applied to each of the capacitors C1m, C1p respectively when the switching network is arranged to operate in the first configuration may be expressed as:

$$Q_{1p} = C_{1p} \cdot (V_{im} - V_{ip})$$
$$Q_{1m} = C_{1m} \cdot (V_{ip} - V_{im})$$
(Equ'n 1)

Thus, each capacitor of the first pair of capacitors (C1m, C1p) stores therein charge representative of the difference between the voltage signals present at the differential inputs (Vim, Vip).

Furthermore, for the illustrated embodiment, the second pair of capacitors (C2m, C2p) maintains feedback loops between outputs and inputs of the amplifier stage 310.

Figure 6:
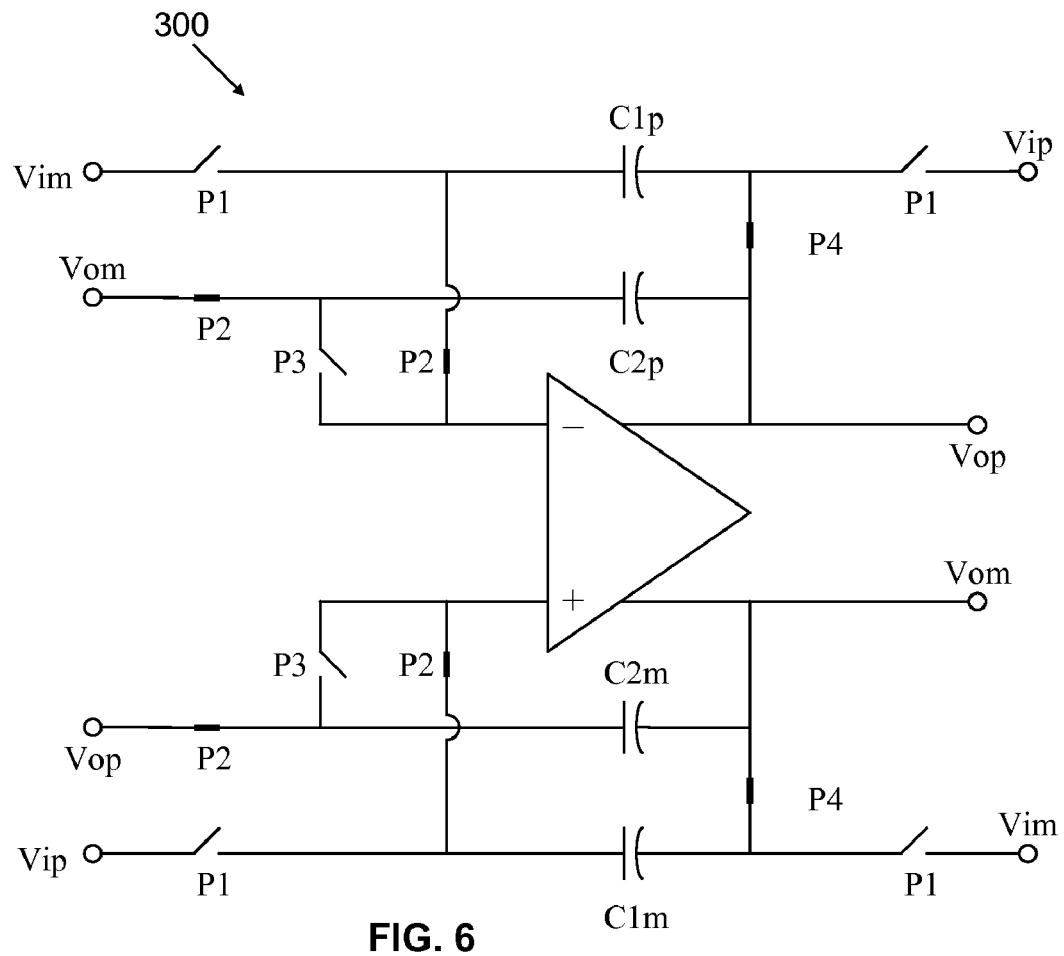

Referring now to FIG. 6, there is illustrated the differential amplifier circuit 300 with the switching network arranged to operate in a second configuration, wherein the differential amplifier stage 310 is set to output signals representative of the voltage signals sampled by the first pair of capacitors (C1m, C1p). In particular, for the embodiment illustrated in FIG. 6, the switching network is configured such that switches P2 and P4 are closed, whilst switches P1 and P3 are open. The respective switches of the switching network are again controlled by switching control logic (as in FIG. 3, but not shown for clarity purposes only).

Figure 7:
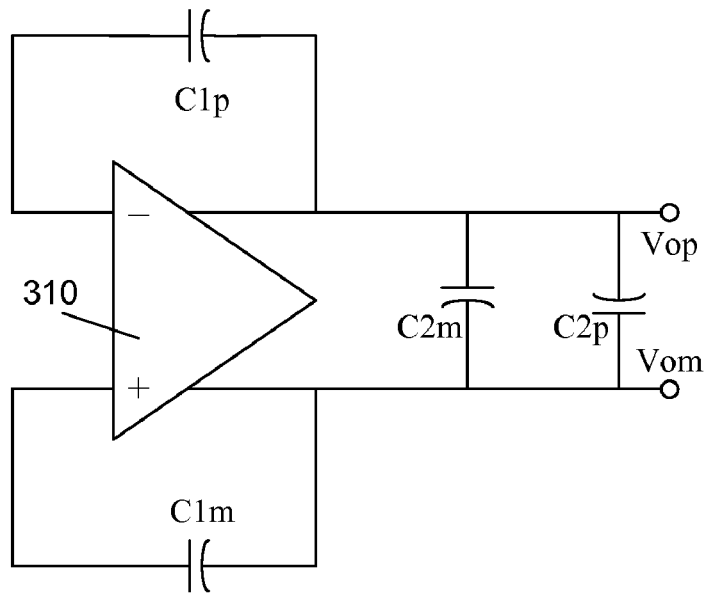

FIG. 7 illustrates the equivalent circuit layout of the differential amplifier circuit 300 with the switching network arranged to operate in the second configuration. As can be seen, each capacitor of the first pair of capacitors (C1m, C1p) is operably coupled within a feedback loop between an output and an input of the amplifier stage 310. In this manner, the charge Q2m, Q2p applied to each of the capacitors C1m, C1p respectively when the switching network is arranged to operate in the second configuration may be expressed as:

$$Q_{2p} = C_{1p} \cdot (V_{icmm}(2) - V_{op}(2))$$
$$Q_{2m} = C_{1m} \cdot (V_{icmp}(2) - V_{om}(2))$$
(Equ'n 2)

where Vop(2) and Vom(2) are the differential output voltage signals of the amplifier stage 310 and Vicmp(2) and Vicmm(2) are the common mode voltage signals at the inputs of the amplifier stage 310 when the switching network is arranged to operate in the second configuration. Since the charges transferred between the first and second configurations are substantially conservative there is no loss or extra charges at the transfer nodes, and the following is true:

$$Q_{1p} = Q_{2p} \text{ and } Q_{1m} = Q_{2m}$$
(Equ'n 3)

Inserting Equations 1 and 2 into Equation 3 gives Equation 4 below:

$$C_{1p} \cdot (V_{im} - V_{ip}) = C_{1p} \cdot (V_{icmm}(2) - V_{op}(2))$$

$$C_{1m} \cdot (V_{ip} - V_{im}) = C_{1m} \cdot (V_{icmp}(2) - V_{om}(2))$$

$$(V_{im} - V_{ip}) = (V_{icmm}(2) - V_{op}(2))$$

$$(V_{ip} - V_{im}) = (V_{icmp}(2) - V_{om}(2))$$

$$V_{op}(2) - V_{om}(2) = 2 \cdot (V_{ip} - V_{im}) - (V_{icmp}(2) - V_{icmm}(2))$$
(Equ'n 4)

As will be appreciated by a skilled artisan, for a high gain amplifier and for the differential signal transfer, the common mode voltage signals (Vicmp, Vicmm) at the inputs of the amplifier stage 310 may be omitted since Vicmp and Vicmm are identical (due to the principle of the amplifier's operation) and therefore may be removed from the equation. Accordingly, this leaves:

$$V_{op}(2) - V_{om}(2) = 2 \cdot (V_{ip} - V_{im})$$
(Equ'n 5)

Thus, when the switching network is arranged to operate in the second configuration, each capacitor of the first pair of capacitors (C1m, C1p) being operably coupled within a feedback loop between an output and an input of the amplifier stage 310 causes the amplifier stage 310 to output substantially twice the difference between the sampled input voltage signals.

Furthermore, for the illustrated embodiment, when the switching network is arranged to operate in the second configuration, the second pair of capacitors (C2m, C2p) are connected in parallel between the outputs Vop, Vom, such that the second pair of capacitors (C2m, C2p) sample the voltage difference between the outputs Vop, Vom, namely Vop(2)−Vom(2), which as illustrated in Equation 5 above is equal to 2·(Vip−Vim). In this manner, when the switching network returns to operating in the first configuration, with the second pair of capacitors (C2m, C2p) maintaining feedback loops between outputs and inputs of the amplifier stage 310, the second pair of capacitors (C2m, C2p) cause the amplifier stage 310 to hold at its output a 2× gain of the previously sampled voltage signal present at the inputs (Vip, Vim) whilst the first pair of capacitors (C1m, C1p) resample the voltage present at the inputs (Vip, Vim). Thus, here, 2*(vip−Vim) is transferred to the output.

In this manner, a 2× gain of a voltage signal present at the inputs (Vip, Vim) may be provided at the outputs of the amplifier stage 310 in two phases: the first phase comprising the switching network arranged to operate in the first configuration, and the second phase comprising the switching network arranged to operate in the second configuration. Furthermore, the configuration of the switching network and the first pair of capacitors (C1m, C1p) results in the system transfer being substantially independent of the capacitor parameters, and thus substantially cancelling any errors caused by capacitor mismatching.

In this manner, not only does the differential amplifier circuit 300 of the illustrated embodiment provide a 2× gain whilst substantially cancelling any errors caused by capacitor mismatching, but also the sampling and holding functions may be performed using only a single amplifier stage 310. As will be appreciated by a skilled artisan, this results in a reduction in both power consumption and required die space in comparison to prior art techniques. Furthermore, for the illustrated embodiment, the differential amplifier circuit 300 only comprises four capacitors, significantly less than prior art techniques, as well as a much simpler switching network, enabling a significant reduction in die size. The present invention also provides the benefit of a simplified system architecture.

From Equation 4 above, we can also see that the common mode voltage at the inputs of the amplifier stage 310 tracks the common mode voltage at the outputs of the amplifier stage 310, as illustrated in Equation 6 below where no voltage signals are present at the inputs (Vip, Vim):

$$\tfrac{1}{2}(V_{op}(2)+V_{om}(2)) = \tfrac{1}{2}(V_{icmp}(2)+V_{icmm}(2))$$

or $$V_{ocm}(2) = V_{icm}(2) \quad \text{(Equ'n 6)}$$

Thus, the input common mode voltage tracks the output common mode voltage.

As will be appreciated by a skilled artisan, Equation 6 assumes that the output common mode for the amplifier stage 310 is set independently, for example using a classical common feedback circuit, with the initial condition comprising a reset state that maintains the core Operational Transconductance Amplifier (OTA) in a unity gain feedback loop so that the input common mode of the OTA tracks its output common mode. Furthermore, in the case where the amplifier stage 310 is suitably balanced, the common mode path is substantially not impacted by the differential signal path.

In accordance with one embodiment of the present invention, at least some of the switches within the switching network comprise boot strapped switches, in order to alleviate problems arising from signal-dependant charge injection.

In switched capacitor designs extra charges can be pulled from the parasitic capacitances into the signal path when the considered switches are being turned off. These extra charges are related to the gate-source voltage. Since the source voltage is related to the actual signal, this will cause non linearity for algorithmic ADCs. Bootstrapped switches by contrast are designed to introduce a constant extra charge and can only result in offsets.

Figure 8:
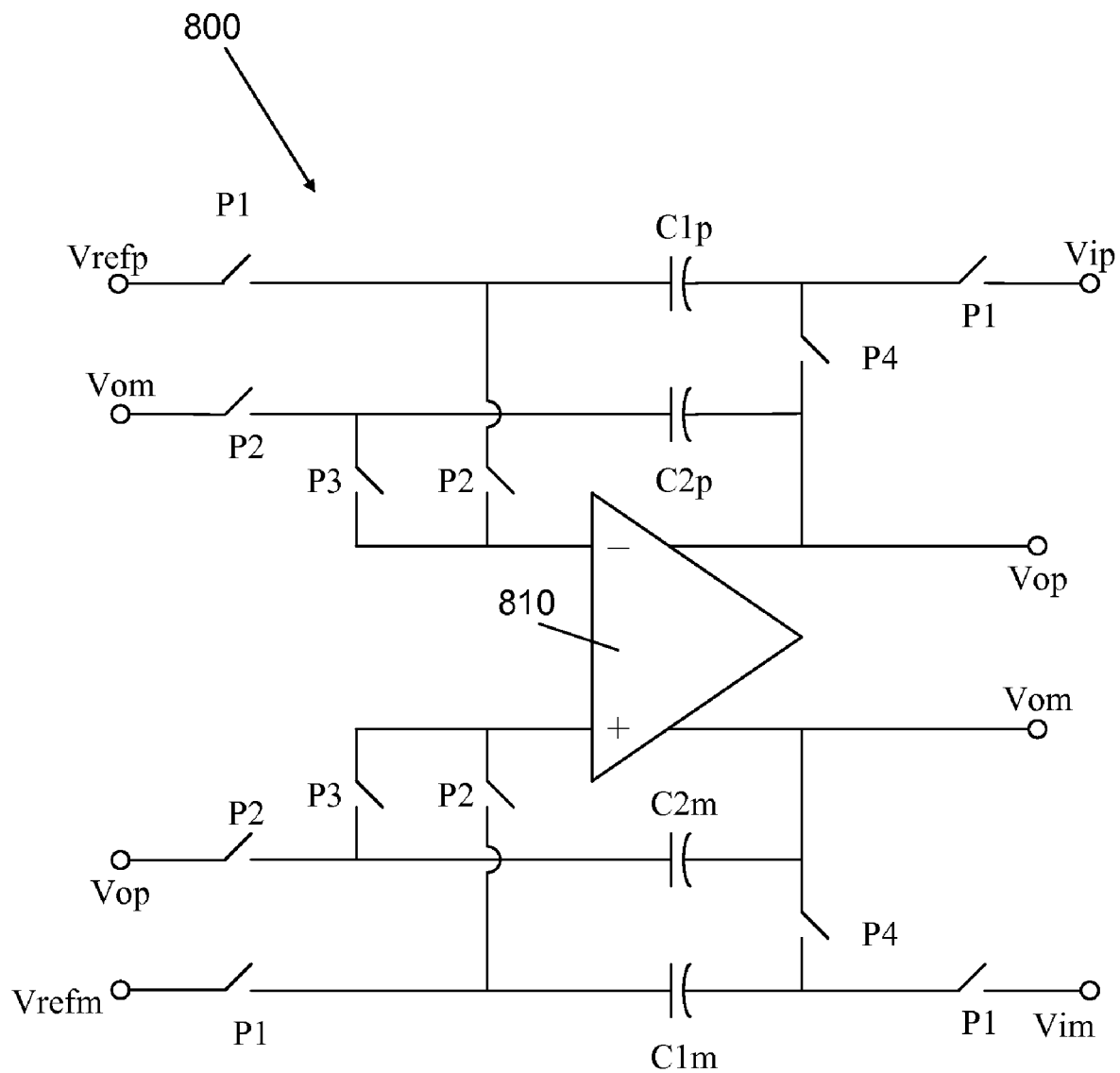

Referring now to FIG. 8, there is illustrated a differential amplifier circuit 800 according to some alternative embodiments of the present invention. The differential amplifier circuit 800 comprises a differential amplifier stage 810 arranged to provide unity gain functionality, first and second differential inputs (Vim, Vip), first and second differential outputs (Vom, Vop), and capacitor mismatch error cancellation circuitry. The capacitor mismatch error cancellation circuitry comprises a first pair of capacitors (C1m, C1p), a second pair of capacitors (C2m, C2p) and a switching network, which for the illustrated embodiment comprises switches P1 to P4. The respective switches of the switching network are again controlled by switching control logic (as in FIG. 3, but not shown for clarity purposes only).

Referring now to FIG. 9, there is illustrated the differential amplifier circuit 800 with the switching network arranged to operate in a first configuration, wherein voltage signals present on the first and second differential inputs (Vim, Vip) are sampled by operably coupling the first pair of capacitors (C1m, C1p) to the first and second differential inputs (Vim, Vip). In particular, for the embodiment illustrated in FIG. 9, the switching network is configured such that switches P1 and P3 are closed, whilst switches P2 and P4 are open. The respective switches of the switching network are again controlled by switching control logic (as in FIG. 3, but not shown for clarity purposes only).

FIG. 10 illustrates the equivalent circuit layout of the differential amplifier circuit 800 with the switching network arranged to operate in the first configuration. As can be seen, the first pair of capacitors (C1m, C1p) is connected between the two differential inputs (Vim, Vip) and reference signals (Vrefm, Vrefp). Here, (Vip−Vim)−(Vrefp−Vrefm) is sampled. In this manner, the charge Q1Am, Q1Ap applied to each of the capacitors C1m, C1p respectively when the switching network is arranged to operate in the first configuration may be expressed as:

$$\left.\begin{array}{l} Q_{1Ap} = C_{1p} \cdot (V_{refp} - V_{ip}) \\ Q_{1Am} = C_{1m} \cdot (V_{refm} - V_{im}) \end{array}\right\} \quad \text{(Equ'n 7)}$$

Thus, when the switching network is arranged to operate in the first configuration, the first pair of capacitors (C1m, C1p) are connected between the inputs (Vim, Vip) of the differential amplifier circuit (800) and reference signals (Vrefm, Vrefp), such that each capacitor of the first pair of capacitors (C1m, C1p) stores therein a charge representative of the difference between each of the voltage signals present at the differential inputs (Vim, Vip) and one of the reference signals (Vrefm, Vrefp) respectively.

Furthermore, for the illustrated embodiment, the second pair of capacitors (C2m, C2p) maintains feedback loops between outputs and inputs of the amplifier stage 810.

Figure 11:
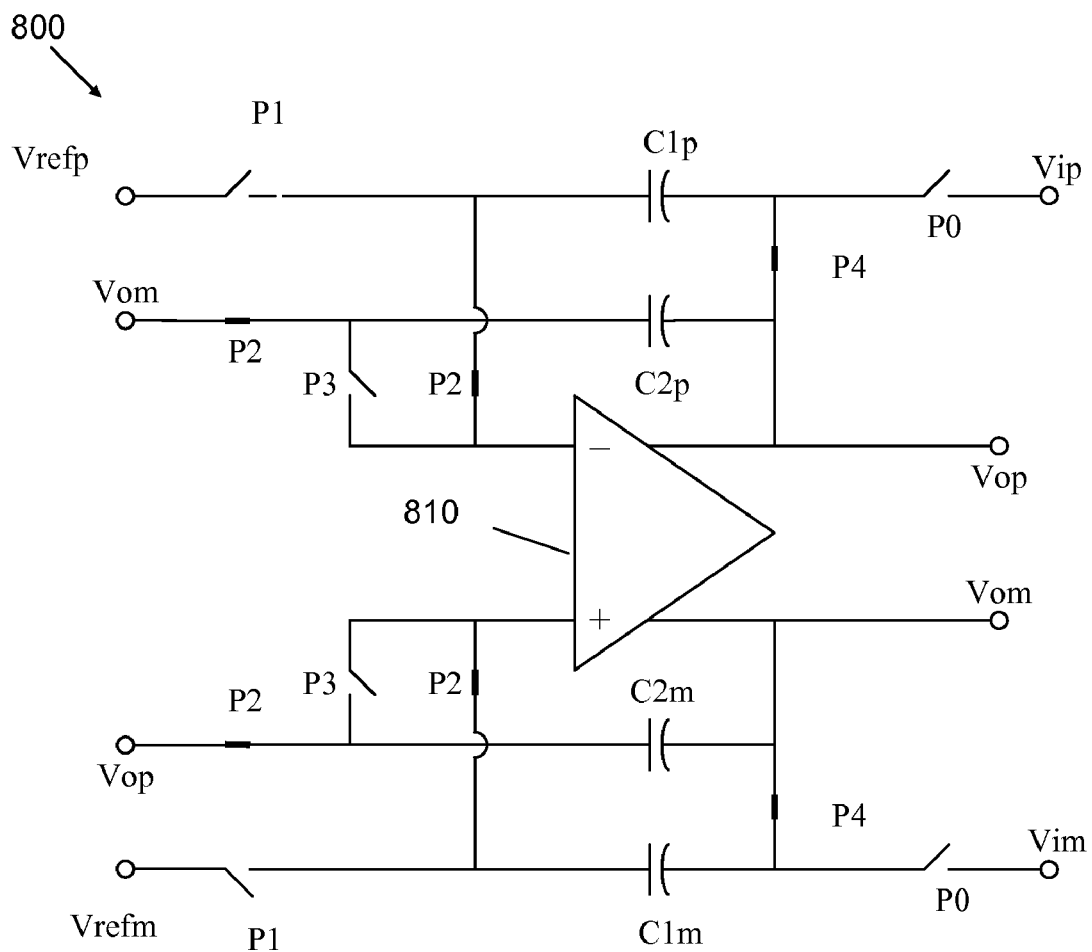

Referring now to FIG. 11, there is illustrated the differential amplifier circuit 800 with the switching network arranged to operate in a second configuration, wherein the differential amplifier stage 810 is set to output signals representative of the voltage signals sampled by the first pair of capacitors (C1m, C1p). In particular, for the embodiment illustrated in FIG. 11, the switching network is configured such that switches P2 and P4 are closed, whilst switches P1 and P3 are open. The respective switches of the switching network are again controlled by switching control logic (as in FIG. 3, but not shown for clarity purposes only).

Figure 12:
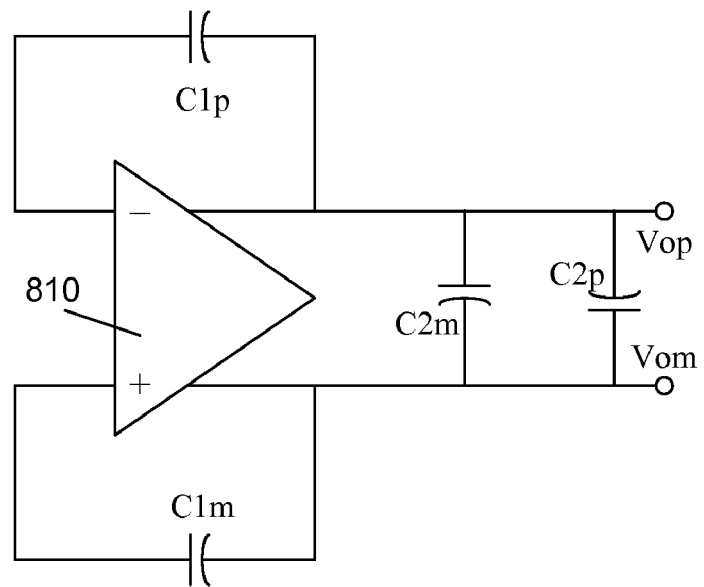

FIG. 12 illustrates the equivalent circuit layout of the differential amplifier circuit 800 with the switching network arranged to operate in the second configuration. As can be seen, the first pair of capacitors (C1m, C1p) is connected within feedback loops between outputs of the differential amplifier stage 810 and inputs thereof. In this manner, the charge Q2Am, Q2Ap applied to each of the capacitors C1m, C1p respectively when the switching network is arranged to operate in the second configuration may be expressed as:

$$Q_{2Ap} = C_{1p} \cdot (V_{icmm}(2) - V_{op}(2))$$
$$Q_{2Am} = C_{1m} \cdot (V_{icmp}(2) - V_{om}(2))$$
(Equ'n 8)

where Vop(2) and Vom(2) are the differential output voltage signals of the amplifier stage 810 and Vicmp(2) and Vicmm (2) are the common mode voltage signals at the inputs of the amplifier stage 810 when the switching network is arranged to operate in the second configuration.

Since the charges transferred between the first and second configurations are substantially conservative, as mentioned previously, the following is true:

$$Q_{1Ap} = Q_{2Ap} \text{ and } Q_{1Am} = Q_{2Am}$$
(Equ'n 9)

Inserting Equations 6 and 7 into Equation 8 gives Equation 10 below:

$$C_{1p} \cdot (V_{refp} - V_{ip}) = C_{1p} \cdot (V_{icmm}(2) - V_{op}(2))$$

$$C_{1m} \cdot (V_{refm} - V_{im}) = C_{1m} \cdot (V_{icmp}(2) - V_{om}(2))$$

$$(V_{refp} - V_{ip}) = (V_{icmm}(2) - V_{op}(2))$$

$$(V_{refm} - V_{im}) = (V_{icmp}(2) - V_{om}(2))$$

$$V_{op}(2) - V_{om}(2) = V_{icmm}(2) - V_{icmp}(2) + V_{ip} - V_{refp} - V_{im} - V_{refm}$$
(Equ'n 10)

As will be appreciated by a skilled artisan, for a high gain amplifier, the common mode voltage signals (Vicmp, Vicmm) at the inputs of the amplifier stage 810 may be omitted, in the same manner as previously mentioned. Accordingly, this leaves:

$$V_{op}(2) - V_{om}(2) = (V_{ip} - V_{im}) - (V_{refp} - V_{refm})$$
(Equ'n 11)

Thus, when the switching network is arranged to operate in the second configuration, each capacitor of the first pair of capacitors (C1m, C1p) being operably coupled within a feedback loop between an output and an input of the amplifier stage 810 causes the amplifier stage 810 to output the combined differences between each of the voltage signals present at the differential inputs (Vim, Vip) and one of the reference signals (Vrefm, Vrefp) respectively. Thus, 2*[(Vip−Vim)−(Vrefp−Vrefm)] is sampled.

Furthermore, for the illustrated embodiment, when the switching network is arranged to operate in the second configuration, the second pair of capacitors (C2m, C2p) are connected in parallel between the outputs Vop, Vom, such that the second pair of capacitors (C2m, C2p) sample the voltage difference between the outputs (Vop, Vom), namely Vop(2)−Vom(2), which as illustrated in Equation 11 above is equivalent to 2.(Vin−Vref). More particularly, for a high gain amplifier, the charge Q3Am, Q3Ap applied to each of the capacitors C2m, C2p respectively when the switching network is arranged to operate in the second configuration may be expressed as:

$$Q_{3Ap} = C_{2p} \cdot (V_{om}(2) - V_{op}(2))$$
$$Q_{3Am} = C_{2m} \cdot (V_{op}(2) - V_{om}(2))$$
(Equ'n 12)

or $$Q_{3Ap} = -C_{2p} \cdot ((V_{ip} - V_{im}) - (V_{refp} - V_{refm}))$$
$$Q_{3Am} = C_{2m} \cdot ((V_{ip} - V_{im}) - (V_{refp} - V_{refm}))$$

Thus, when the switching network is arranged to operate in the second configuration, each capacitor of the second pair of capacitors (C2m, C2p) being operably coupled in parallel between the outputs of the amplifier stage 810 causes each capacitor of the second pair of capacitors (C2m, C2p) to store a charge representative of the combined differences between each of the voltage signals present at the differential inputs (Vim, Vip) and one of the reference signals (Vrefm, Vrefp) respectively, as sampled when the switching network was previously arranged to operate in the first configuration.

Figure 13:
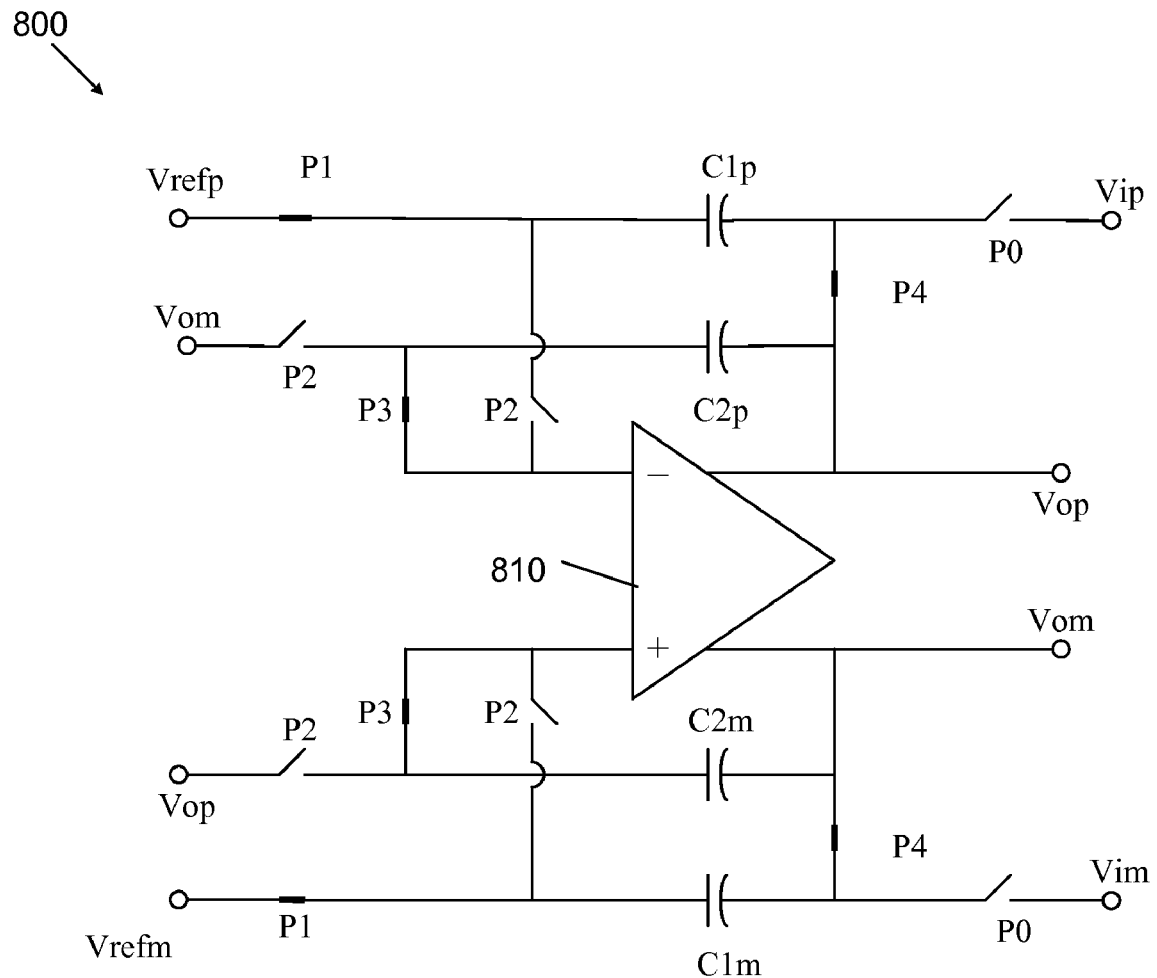

Referring now to FIG. 13, there is illustrated the differential amplifier circuit 800 with the switching network arranged to operate in a third configuration, wherein the differential amplifier stage 810 is set to output signals representative of the voltage signals sampled by the second pair of capacitors (C2m, C2p), namely Vop(2)−Vom(2), which as illustrated in Equation 11 above is equivalent to 2.(Vin−Vref). In particular, for the embodiment illustrated in FIG. 13, the switching network is configured such that switches P3 and P4 are closed, whilst switches P1 and P2 are open. The respective switches of the switching network are again controlled by switching control logic (as in FIG. 3, but not shown for clarity purposes only).

Figure 14:
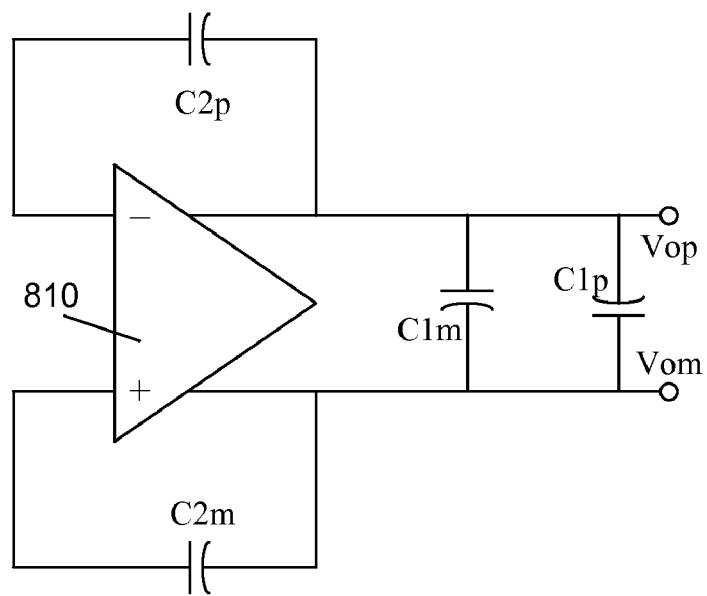

FIG. 14 illustrates the equivalent circuit layout of the differential amplifier circuit 800 with the switching network arranged to operate in the third configuration. As can be seen, each capacitor of the second pair of capacitors (C2m, C2p) is operably coupled within a feedback loop between an output and an input of the amplifier stage 810. In this manner, the charge Q4Am, Q4Ap applied to each of the capacitors C2m, C2p respectively when the switching network is arranged to operate in the third configuration may be expressed as:

$$Q_{4Ap} = C_{2p} \cdot (V_{icmm}(3) - V_{op}(3))$$
$$Q_{4Am} = C_{2m} \cdot (V_{icmp}(3) - V_{om}(3))$$
(Equ'n 13)

where Vop(3) and Vom(3) are the differential output voltage signals of the amplifier stage 810 and Vicmp(3) and Vicmm (3) are the common mode voltage signals at the inputs of the amplifier stage 810 when the switching network is arranged to operate in the third configuration. Since the charges transferred between the first and second configurations are substantially conservative, as mentioned above, the following is true:

$$Q_{3AP} = Q_{4AP} \text{ and } Q_{3Am} = Q_{4Am}$$
(Equ'n 14)

Inserting Equations 12 and 13 into Equation 14 gives Equation 15 below:

$$-C_{2p} \cdot ((V_{ip} - V_{im}) - (V_{refp} - V_{refm})) = C_{2p} \cdot (V_{icmm}(3) - V_{op}(3))$$

$$C_{2m} \cdot ((V_{ip} - V_{im}) - (V_{refp} - V_{refm})) = C_{2m} \cdot (V_{icmp}(3) - V_{om}(3))$$

or $$-((V_{ip} - V_{im}) - (V_{refp} - V_{refm})) = (V_{icmm}(3) - V_{op}(3))$$

$$((V_{ip} - V_{im}) - (V_{refp} - V_{refm})) = (V_{icmp}(3) - V_{om}(3))$$

or $$V_{op}(3) - V_{om}(3) = V_{icmm}(3) - V_{icmp}(3) + 2 \cdot ((V_{ip} - V_{im}) - (V_{refp} - V_{refm}))$$
(Equ'n 15)

Again, as will be appreciated by a skilled artisan, for a high gain amplifier, the common mode voltage signals (Vicmp, Vicmm) at the inputs of the amplifier stage 810 may be omitted. Accordingly, this leaves:

$$V_{op}(3)-V_{om}(3)=2\cdot((V_{ip}-V_{im})-(V_{refp}-V_{refm}))$$

or $$V_{out}(3)=2\cdot(V_{in}-V_{ref})$$

where $$V_{in}=V_{ip}-V_{im},\ V_{ref}=V_{refp}-V_{refm},\ V_{out}=Vop-Vom \quad \text{(Equ'n 16)}$$

Thus, when the switching network is arranged to operate in the third configuration, each capacitor of the second pair of capacitors (C2m, C2p) being operably coupled within a feedback loop between an output and an input of the amplifier stage (810) causes the amplifier stage (810) to output substantially twice the combined differences between each of the voltage signals present at the differential inputs (Vim, Vip) and one of the reference signals (Vrefm, Vrefp) respectively, as sampled when the switching network was previously arranged to operate in the first configuration.

Furthermore, for the illustrated embodiment, when the switching network is arranged to operate in the third configuration, the first pair of capacitors (C1m, C1p) are connected in parallel between the outputs Vop, Vom, such that the first pair of capacitors (C1m, C1p) sample the voltage difference between the outputs Vop, Vom, namely Vop(3)−Vom(3), which as illustrated in Equation 16 above is equal to 2·(Vin−Vref). One advantageous reason for coupling the first pair of capacitors in this manner is that it allows capacitor error cancellation both on Vin and Vref sampling. Thus, (Vop−Vom)−(Vrefp−Vrefm) is sampled (in a new cycle).

In this manner, a 2·(Vin−Vref) voltage signal may be provided at the outputs of the amplifier stage 810 in three phases: the first phase comprising the switching network arranged to operate in the first configuration, the second phase comprising the switching network arranged to operate in the second configuration, and the third phase comprising the switching network arranged to operate in the third configuration. Furthermore, the configuration of the switching network and the first and second pairs of capacitors (C1m, C1p, C2m, C2p) results in the system transfer being substantially independent of the capacitor parameters, and thus substantially cancelling any errors caused by capacitor mismatching.

In this manner, not only does the differential amplifier circuit 800 of the illustrated embodiment provide a 2·(Vin−Vref) voltage signal whilst substantially cancelling any errors caused by capacitor mismatching, but also the sampling and holding functions may be performed using only a single amplifier stage 810. As will be appreciated by a skilled artisan, this results in a reduction in both power consumption and required die space in comparison to prior art techniques. Furthermore, for the illustrated embodiment, the differential amplifier circuit 800 only comprises four capacitors, significantly less than prior art techniques, as well as a much simpler switching network, enabling a significant reduction in die size.

Figure 15:
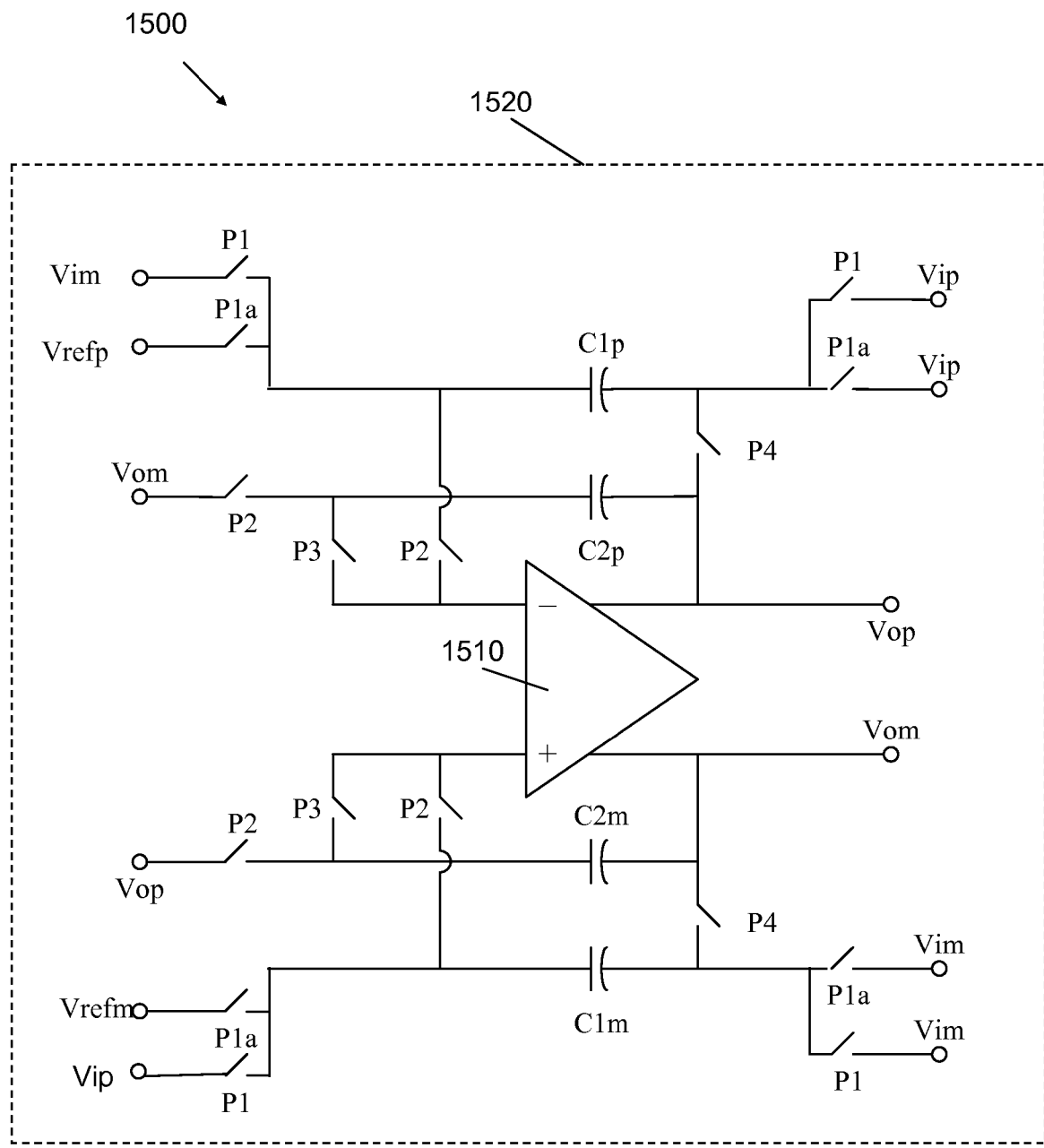
FIGS. 15 and 16 illustrate a differential amplifier circuit according to some further alternative embodiments of the present invention.

Referring now to FIG. 15, there is illustrated a differential amplifier circuit 1500 according to some further alternative embodiments of the present invention. The differential amplifier circuit 1500 is arranged to provide 2× gain functionality in the same manner as for the embodiment illustrated and described with reference to FIGS. 3 to 7, and also to provide 2·(Vin−Vref) functionality in the same manner as for the embodiment illustrated and described with reference to FIGS. 6 to 14.

Figure 16:
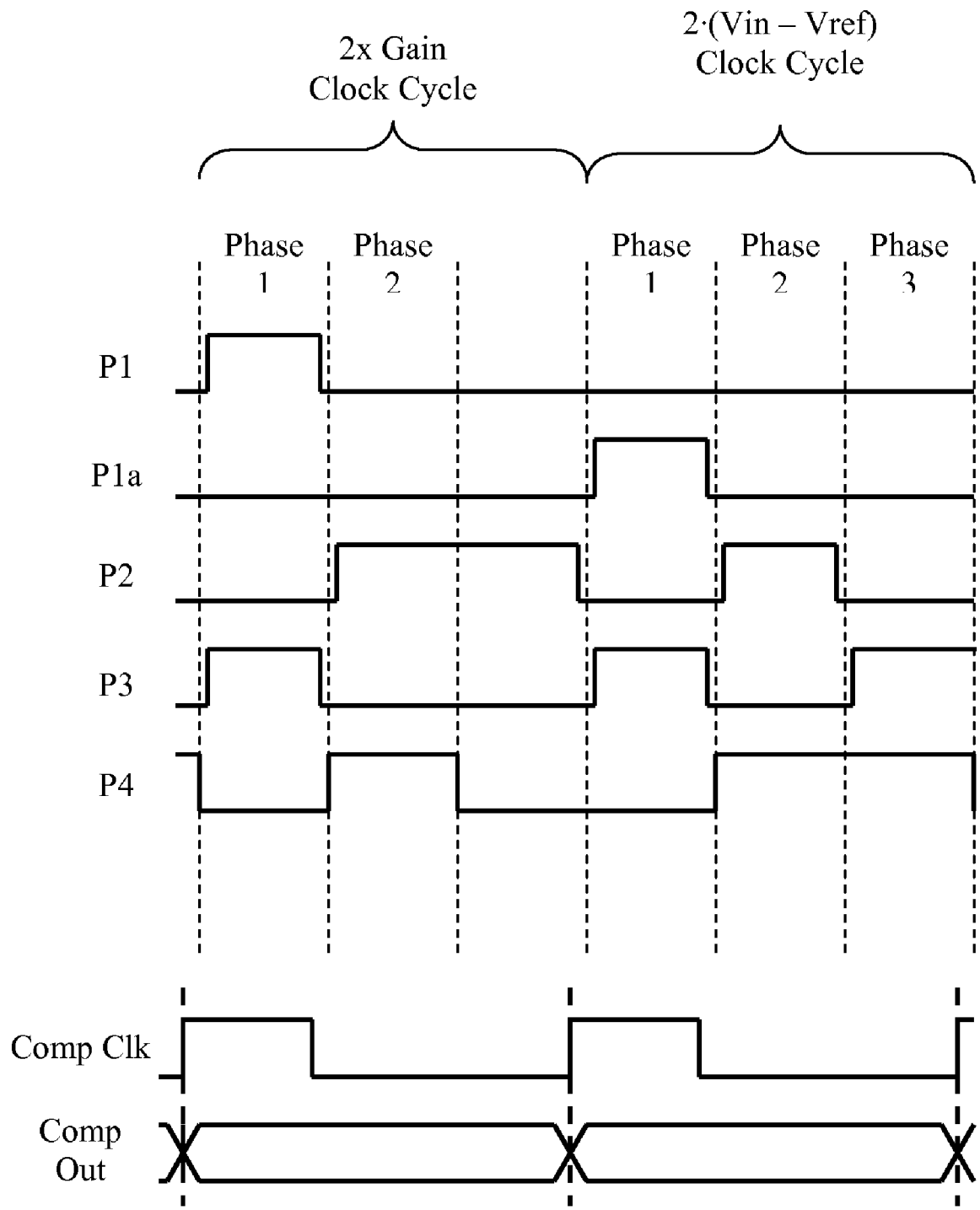

FIG. 16 illustrates a timing diagram for the differential amplifier circuit 1500, for example when the differential amplifier circuit 1500 forms a part of a comparator within a cyclic analogue to digital converter (ADC) 1520. For the implementation illustrated in FIG. 16, the ADC uses a three-phase clock, in which the output of the comparator (Comp Out) is valid on the rising edge of the comparator clock (Comp Clk), so that the ×2 amp knows in which direction to operate. As would be appreciated by a skilled artisan, the comparators output are post-processed as 'd' and 'd' is used for the computation. Thus, during the first period (P1), Vout−d*Vref is sampled according to the loop state, where d is a member of {−1,0,1}.

For the timing diagram illustrated in FIG. 16, for the first clock cycle, comprising three phases, a 2× gain of the input signals is generated at the output, in phases 1 and 2 of the clock cycle, and held at the output (by maintaining switch P3 closed) during phase 3. For the second clock cycle, a 2·(Vin−Vref) signal is generated at the output in phases 1, 2 and 3 of the clock cycle. X2 clock cycle uses a classical two phase clock. 2.(Vin−Vref) uses a 3-phase clock.

As will be appreciated by a skilled artisan, the inventive concept described herein may be implemented within a wide range of devices comprising analogue to digital converters, as well as within other analogue circuits.

It will be understood that the differential amplifier circuit, as described above, aims to provide at least one or more of the following advantages:
(i) averaging of capacitor mismatch error; using only a single stage, removing the need for separate sample and hold stage;
(ii) improved cyclic ADC linearity;
(iii) simplified architecture;
(iv) reduced silicon area requirements;
(v) reduced power consumption;
(vi) reduced conversion time;
(vii) improved integral non linearity error;
(viii) increased resolution; and
(ix) re-usable ADC that are robust over process variations.

In particular, it is envisaged that the aforementioned inventive concept can be applied by a semiconductor manufacturer to any integrated circuit architecture supporting an improved differential amplifier circuit. It is further envisaged that, for example, a semiconductor manufacturer may employ the inventive concept in a design of a stand-alone device, or application-specific integrated circuit (ASIC) and/or any other sub-system element employing an integrated circuit to support an improved differential amplifier circuit.

It will be appreciated that any suitable distribution of functionality between different functional units or controllers or memory elements, may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the present invention has been described in connection with some examples of embodiments, it is not intended to be limited to the specific form set forth herein.

Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second' etc. do not preclude a plurality.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A differential amplifier circuit comprising:
   capacitor mismatch error cancellation circuitry;
   a differential amplifier operably coupled to the capacitor mismatch error cancellation circuitry, the capacitor mismatch error cancellation circuitry comprising a first pair of capacitors, a second pair of capacitors, and a switching network;
   wherein the switching network is arranged to operate in a first configuration wherein the first pair of capacitors is operably coupled to differential inputs of the differential amplifier such that the first pair of capacitors sample input voltage signals present on the differential inputs, and each capacitor of the second pair of capacitors is operably coupled within a feedback loop between an output and an input of the differential amplifier;
   wherein the switching network is further arranged to operate in a second configuration wherein each capacitor of the first pair of capacitors is operably coupled within a feedback loop between an output and an input of the differential amplifier such that the differential amplifier is set to output signals representative of the sampled input voltage signals, and the second pair of capacitors is operably coupled in parallel between outputs of the differential amplifier such that the second pair of capacitors sample the voltage difference between the outputs.

2. The differential amplifier circuits of claim 1 wherein, when the switching network is arranged to operate in the first configuration, the first pair of capacitors is connected in parallel between the two differential inputs of the differential amplifier circuit such that each capacitor of the first pair of capacitors stores therein a charge representative of a difference between the voltage signals present at the differential inputs.

3. The differential amplifier circuit of claim 2 wherein, when the switching network is arranged to operate in the second configuration, each capacitor of the first pair of capacitors is operably coupled within the feedback loop between the output and the input of the differential amplifier to output twice the difference between the sampled input voltage signals.

4. The differential amplifier circuit of claim 1 wherein, when the switching network is arranged to operate in the first configuration, the first pair of capacitors is connected between the inputs of the differential amplifier circuit and at least one reference signal applied to the differential amplifier circuit such that each capacitor of the first pair of capacitors stores therein a charge representative of a difference between each input voltage signal present at the differential inputs and at least one of the reference signals.

5. The differential amplifier circuit of claim 4 wherein, when the switching network is arranged to operate in the second configuration, each capacitor of the first pair of capacitors is operably coupled within the feedback loop between the output and the input of the differential amplifier thereby causing the differential amplifier to output a combined difference between each of the voltage signals present at the differential inputs at and one of the reference signals, as sampled when the switching network was previously arranged to operate in the first configuration.

6. The differential amplifier circuit of claim 5 wherein, when the switching network is arranged to operate in the second configuration, each capacitor of the second pair of capacitors is operably coupled in parallel between the outputs of the differential amplifier thereby causing each capacitor of the second pair of capacitors to store a charge representative of a combined difference between each of the voltage signals present at the differential inputs and at least one reference signal, as sampled when the switching network was previously arranged to operate in the first configuration.

7. The differential amplifier circuit of claim 4 wherein the switching network being further arranged to operate in a third configuration wherein each capacitor of the second pair of capacitors is operably coupled within a feedback loop between an output and an input of the differential amplifier such that the differential amplifier outputs signals representative of the voltage signals sampled by the second pair of capacitors.

8. The differential amplifier circuit of claim 7 wherein, when the switching network is arranged to operate in the third configuration, each capacitor of the second pair of capacitors is operably coupled within the feedback loop between the output and the input of the differential amplifier thereby causing the differential amplifier to output twice a combined difference between each of the voltage signals present at the differential inputs and at least one reference signal, as sampled when the switching network was previously arranged to operate in the first configuration.

9. The differential amplifier circuit according to claim 1 wherein the differential amplifier comprising an Operational Transconductance Amplifier (OTA).

10. The differential amplifier circuit according to claim 1 wherein the switching network comprising a plurality of switches, at least some of which comprise boot strapped switches.

11. The differential amplifier circuit according to claim 1 wherein the differential amplifier circuit forming a part of a comparator within a cyclic analogue to digital converter.

12. An analogue-to-digital converter comprising:
   a differential amplifier circuit comprising capacitor mismatch error cancellation circuitry and a differential amplifier operably coupled to the capacitor mismatch error cancellation circuitry, the capacitor mismatch error cancellation circuitry comprising a first pair of capacitors, a second pair of capacitors and a switching network;

wherein the switching network is arranged to operate a first configuration wherein the first pair of capacitors is operably coupled to differential inputs of the differential amplifier circuit such that the first pair of capacitors sample input voltage signals present on the differential inputs, and each capacitor of the second pair of capacitors is operably coupled within a feedback loop between an output and an input of the differential amplifier; and wherein the switching network is further arranged to operate in a second configuration wherein each capacitor of the first pair of capacitors is operably coupled within a feedback loop between an output and an input of the differential amplifier such that the differential amplifier is set to output signals representative of the sampled input voltage signals, and the second pair of capacitors is operably coupled in parallel between outputs of the differential amplifier such that the second pair of capacitors sample the voltage difference between the outputs.

13. A semiconductor device comprising a differential amplifier circuit according to claim 1.

14. The differential amplifier circuit of claim 5 wherein the switching network being further arranged to operate in a third configuration wherein each capacitor of the second pair of capacitors is operably coupled within a feedback loop between an output and an input of the differential amplifier such that the differential amplifier outputs signals representative of the voltage signals sampled by the second pair of capacitors.

15. The differential amplifier circuit of claim 6 wherein the switching network being further arranged to operate in a third configuration wherein each capacitor of the second pair of capacitors is operably coupled within the feedback loop between the output and the input of the differential amplifier such that the differential amplifier outputs signals representative of the voltage signals sampled by the second pair of capacitors.

16. The differential amplifier circuit according to claim 2 wherein the switching network comprising a plurality of switches, at least some of which comprise boot strapped switches.

17. The differential amplifier circuit according to claim 3 wherein the switching network comprising a plurality of switches, at least some of which comprise boot strapped switches.

18. The differential amplifier circuit according to claim 4 wherein the switching network comprising a plurality of switches, at least some of which comprise boot strapped switches.

19. The differential amplifier circuit according to claim 2 wherein the differential amplifier circuit forming a part of a comparator within a cyclic analogue to digital converter.

20. The differential amplifier circuit according to claim 3 wherein the differential amplifier circuit forming a part of a comparator within a cyclic analogue to digital converter.

* * * * *